(12) United States Patent
Kim et al.

(10) Patent No.: US 12,237,048 B2
(45) Date of Patent: Feb. 25, 2025

(54) MEMORY DEVICE, MEMORY SYSTEM HAVING THE SAME, AND METHOD OF OPERATING THE SAME

(71) Applicant: Samsung Electronics Co., Ltd., Suwon-si (KR)

(72) Inventors: Hijung Kim, Suwon-si (KR); Kwangchol Choe, Seoul (KR); Kwangsook Noh, Suwon-si (KR); Jaepil Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 191 days.

(21) Appl. No.: 17/852,593

(22) Filed: Jun. 29, 2022

(65) Prior Publication Data

US 2023/0186960 A1 Jun. 15, 2023

(30) Foreign Application Priority Data

Nov. 17, 2021 (KR) ........................ 10-2021-0158855

(51) Int. Cl.
*G11C 7/22* (2006.01)
*G11C 7/10* (2006.01)
*G11C 7/12* (2006.01)
*G11C 8/14* (2006.01)
*H03K 19/017* (2006.01)

(52) U.S. Cl.
CPC ............ *G11C 7/222* (2013.01); *G11C 7/1039* (2013.01); *G11C 7/12* (2013.01); *G11C 8/14* (2013.01); *H03K 19/01742* (2013.01)

(58) Field of Classification Search
CPC ....................................................... G11C 7/22
USPC ....................................................... 365/233.1
See application file for complete search history.

(56) References Cited

U.S. PATENT DOCUMENTS

| | | | |
|---|---|---|---|
| 6,088,291 A * | 7/2000 | Fujioka | G11C 11/4091 |
| | | | 365/233.14 |
| 6,897,696 B2 | 5/2005 | Chang | |
| 9,128,146 B2 | 9/2015 | Yamagishi | |
| 9,843,310 B2 | 12/2017 | Deng | |
| 10,110,227 B2 | 10/2018 | Kim | |
| 10,615,785 B1 | 4/2020 | Chou et al. | |
| 10,923,175 B2 | 2/2021 | Moon et al. | |
| 2011/0292708 A1 * | 12/2011 | Kang | H01L 23/481 |
| | | | 257/737 |
| 2018/0069532 A1 | 3/2018 | Choi et al. | |
| 2018/0101192 A1 | 4/2018 | Mazzucchelli et al. | |
| 2020/0228105 A1 * | 7/2020 | Zhou | H03K 5/1252 |

FOREIGN PATENT DOCUMENTS

KR      1020180026957 A      3/2018

* cited by examiner

*Primary Examiner* — Muna A Techane
(74) *Attorney, Agent, or Firm* — Muir Patent Law, PLLC

(57) ABSTRACT

A memory device includes a memory cell array having memory cells connected to wordlines and bitlines, and a clock buffer receiving a clock signal for performing a read operation or a write operation on at least one of the memory cells. The clock buffer includes a plurality of serially connected clock repeaters, and the plurality of clock repeaters have at least one pair of clock repeaters having different imbalanced driving capabilities.

20 Claims, 18 Drawing Sheets

MEMORY DEVICE, MEMORY SYSTEM HAVING THE SAME, AND METHOD OF OPERATING THE SAME

CROSS-REFERENCE TO RELATED APPLICATION(S)

This application claims priority under 35 USC 119 (a) to Korean Patent Application No. 10-2021-0158855 filed on Nov. 17, 2021 in the Korean Intellectual Property Office, the entire disclosure of which is incorporated herein by reference.

BACKGROUND

The present inventive concept relates to a memory device, a memory system including the same, and a method of operating the same.

In general, semiconductor memory devices may be divided into nonvolatile memory devices, such as NAND flash memory devices, and volatile memory devices, such as dynamic random access memories (DRAMs). By adjusting or correcting parameters based on codes in various devices, parameters necessary for device operation may be set to required or specified values. For example, a duty cycle correction circuit enables the clock signal to have a required or specified target duty value by adjusting the duty of the clock signal based on a code, and an impedance calibration circuit or a ZQ calibration circuit forms an impedance value required or used based on the code.

SUMMARY

Example embodiments provide a memory device for removing/correcting a duty error of a signal, a memory system including the same, and a method of operating the same.

According to example embodiments, a memory device includes a memory cell array having memory cells connected to wordlines and bitlines; and a clock buffer receiving a clock signal for performing a read operation or a write operation on at least one of the memory cells. The clock buffer includes a plurality of serially connected clock repeaters, and the plurality of clock repeaters have at least one pair of clock repeaters comprising a first clock repeater in which a driving capability of a P-channel metal oxide semiconductor (PMOS) transistor is higher than a driving capability of an N-channel metal oxide semiconductor (NMOS) transistor, and a second clock repeater in which a driving capability of a PMOS transistor is lower than a driving capability of an NMOS transistor.

According to example embodiments, a memory device includes a first clock repeater; and a second clock repeater. Each of the first and second clock repeaters includes a first inverter inverting a clock signal, and a second inverter inverting a clock signal output from the first inverter. The second inverter of the first clock repeater has an imbalanced driving capability in a first direction, and the second inverter of the second clock repeater has an imbalanced driving capability in a second direction.

According to example embodiments, a memory system includes a memory device; and a memory controller controlling the memory device. The memory device includes a clock buffer receiving a clock signal from the memory controller, the clock buffer includes a plurality of serially connected clock repeaters, and the plurality of clock repeaters have at least one pair of clock repeaters comprising a first clock repeater in which a driving capability of a PMOS transistor is higher than a driving capability of an NMOS transistor, and a second clock repeater in which a driving capability of a PMOS transistor is lower than a driving capability of an NMOS transistor.

According to example embodiments, a method of operating a memory device includes performing training for adjusting a duty cycle of a clock buffer; storing duty cycle monitoring information according to a result of the training; and adjusting the duty cycle of the clock buffer according to an adjustment code corresponding to the duty cycle monitoring information. The clock buffer includes a clock repeater path, and the clock repeater path is composed of a combination of at least one first clock repeater having a balanced driving capability and at least one second clock repeater having an imbalanced driving capability.

According to example embodiments, a memory device includes a first clock repeater path configured to receive a clock signal in a normal mode; and a second clock repeater path configured to receive the clock signal in high speed mode. The second clock repeater path includes first clock repeaters having an imbalanced driving capability in a first direction; and second clock repeaters having an imbalanced driving capability in a second direction, the first direction is a direction to increase pull-up strength, and the second direction is a direction to increase pull-down strength.

According to example embodiments, a memory device includes a coarse clock repeater path receiving a clock signal; and a fine clock repeater path receiving a clock signal output from the coarse clock repeater path. At least one of the coarse clock repeater path and the fine clock repeater path includes at least one clock repeater having an imbalanced driving capability.

According to example embodiments, a method of operating a memory device includes receiving an operating mode from a memory controller; and selecting a clock repeater path according to the operating mode. The clock repeater path includes a first clock repeater path and a second clock repeater path, and the second clock repeater path includes a first inverter having an imbalanced driving capability in a first direction, and a second inverter having an imbalanced driving capability in a second direction, different from the first direction.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described in detail with reference to the accompanying drawings.

As a memory device according to an example embodiment includes a clock repeater having intentional characteristic imbalance, a duty error of signals (clock, DQ, DQS, etc.) transmitted through a clock repeater path may be removed/corrected. In this case, the clock repeater may include at least two inverters that intentionally cause a characteristic imbalance between a P-channel metal oxide semiconductor (PMOS) transistor and an N-channel metal oxide semiconductor (NMOS) transistor. In this case, the directions of the imbalance in the driving capability of the at least two inverters are different from each other. By enabling the directions of the intentional characteristic imbalance to be different from each other, the directions (or tendency) of the process error may be opposite to each other. Therefore, the duty errors may cancel each other out inside of the clock repeater.

Figure 1:
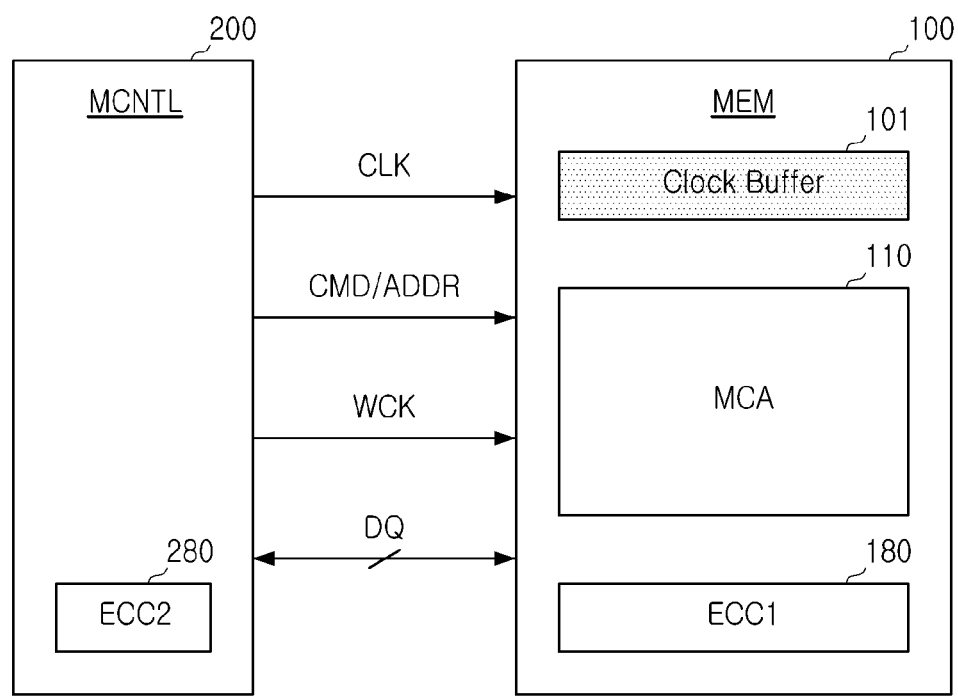
FIG. 1 is a diagram illustrating, by way of example, a memory system according to an example embodiment.

FIG. 1 is a diagram illustrating, by way of example, a memory system according to an example embodiment. Referring to FIG. 1, a memory system 10 may include a memory device 100 (MEM) and a memory controller 200 (MCNTL).

The memory system 10 may be implemented to be included in a personal computer or a mobile electronic device. The mobile electronic device may be implemented, for example, as a Laptop Computer, a Mobile Phone, a Smartphone, a Tablet PC, a Personal Digital Assistant (PDA), an Enterprise Digital Assistant (EDA), a digital still camera, a digital video camera, a Portable Multimedia Player (PMP), a Personal Navigation Device or Portable Navigation Device (PND), a handheld game console, a Mobile Internet Device (MID), a wearable computer, an Internet of Things (IoT) device, an Internet of Everything (IoE) device, or a drone.

The memory device 100 (MEM) may be implemented as a volatile memory device. The volatile memory device may be implemented as random access memory (RAM), dynamic RAM (DRAM), static RAM (SRAM), or low power double data rate (LPDDR) DRAM. In another embodiment, the memory device 100 may be implemented as a non-volatile memory device. Illustratively, the memory device MD may be implemented as an Electrically erasable programmable read-only memory (EEPROM), flash memory, MRAM, STT-MRAM, ferroelectric RAM (FeRAM), phase change RAM (PRAM), resistive RAM (RRAM), nanotube RRAM, Polymer RAM (PoRAM), Nano Floating Gate Memory (NFGM), holographic memory, molecular electronic memory device, or an insulator resistance change memory.

The memory device 100 may include a clock buffer 101, a memory cell array 110 (MCA), and a first error correction circuit 180 (ECC1).

The clock buffer 101 may be implemented to buffer a clock (CLK, WCK, etc.) received from the outside (e.g., from outside the memory device 100). The clock buffer 101 may include sequential, serially connected clock repeaters. In this case, each of the clock repeaters may be implemented to have an intentional imbalance characteristic in order to remove a duty error. For example, the at least one clock repeater may include an inverter implemented with a PMOS transistor and an NMOS transistor having an imbalance characteristic. In an example embodiment, the clock repeaters may include at least one clock repeater pair including a first inverter implemented to have a characteristic that is imbalanced in a first direction and a second inverter implemented to have a characteristic that is imbalanced in a second direction. In this case, the second direction is different from the first direction.

The memory cell array 110 may include a plurality of memory cells connected to wordlines and bitlines.

The first error correction circuit ECC1 may include first and second error correction units (also described as sub-circuits) that perform error correction in different ways according to a physical location (or address). When the occurrence location of a non-single bit error (NSB) inside of data is different for each fault according to a physical location inside the memory device 100, the memory device 100 may be enabled to correct the error in the first error correction circuit ECC1 of the On-die Error Correction Code (OD-ECC), or to generate mis-correction of OD-ECC in the correctable area in the second error correction circuit (ECC2, system ECC) of the controller 200.

The memory controller 200 (MCNTL) may be implemented as an integrated circuit, a system on chip (SoC), an application processor (AP), a mobile AP, a chipset, or a set of chips. The memory controller 200 may include a random access memory (RAM), a central processing unit (CPU), a graphics processing unit (GPU), a neural processing unit (NPU), or a modem. In an example embodiment, the memory controller 200 may perform a function of a modem and a function of an AP.

The memory controller 200 may be implemented to control the memory device 100 to read data stored in the memory device 100 or write data to the memory device 100. The memory controller 200 may control a write operation or a read operation on the memory device 100 by providing a command CMD and an address ADDR to the memory device 100 in synchronization with the clock CLK. Also, the data DQ may be transmitted/received between the memory controller 200 and the memory device 100 in synchronization with the data transmission clock WCK.

Also, the memory controller 200 may include a second error correction circuit ECC2 that corrects an error in the data DQ transmitted and received with the memory device 100.

In a general memory device, by accumulating the duty error of the clock signal transmitted through the clock repeater path due to Process, Voltage, Temperature (PVT) fluctuations, the reliability of the clock is reduced.

On the other hand, the memory device 100 according to embodiments of the present inventive concept includes a clock repeater composed of inverters having characteristics that are imbalanced in different directions, thereby significantly reducing the duty error accumulated through the clock repeater path.

The memory system 10 according to an example embodiment includes the memory device 100 for removing a duty error with respect to a clock signal, and thus, the reliability of the clock signal may be improved, and overall system performance may be expected to improve.

Figure 2:
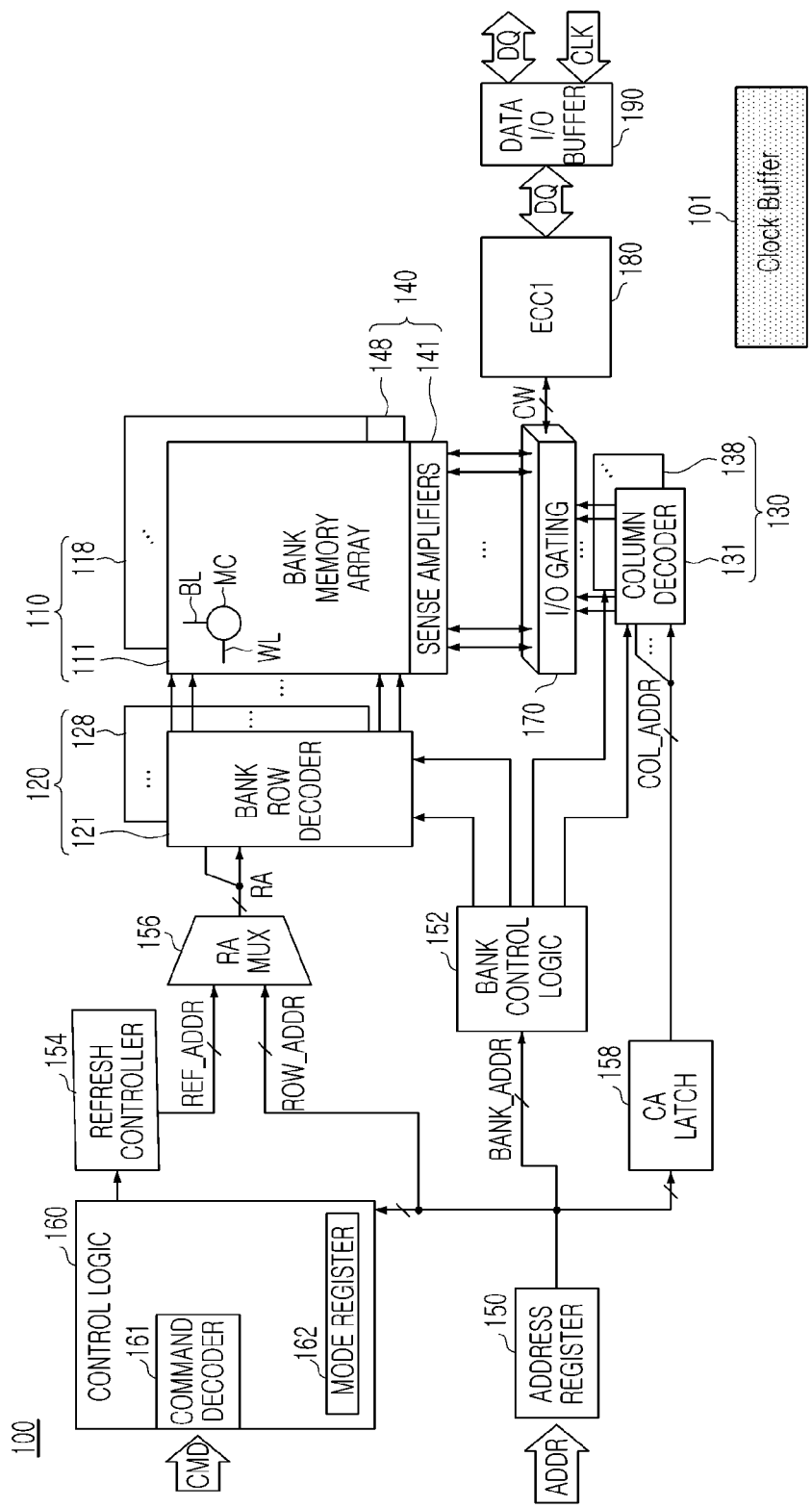
FIG. 2 is a diagram illustrating a memory device 100 according to an example embodiment.

FIG. 2 is a diagram illustrating a memory device 100 according to an example embodiment. Referring to FIG. 2, the memory device 100 may include the clock buffer 101, the memory cell array 110, a row decoder 120, a column decoder 130, a sense amplifier circuit 140, an address register 150, a bank control logic 152, a refresh counter 154, a row address multiplexer 156, a column address latch 158, a control logic 160, a repair control circuit (not shown), a timing control circuit (not shown), an input/output gating circuit 170, an error correction circuit 180, and an I/O buffer (190).

The clock buffer 101 may include a clock repeater path for receiving a clock signal and using it as an internal clock. In this case, the clock repeater path may include at least two inverters having different imbalance characteristics.

The memory cell array 110 may include first to eighth banks 111 to 118. On the other hand, it should be understood that the number of banks of the memory cell array 110 is not limited thereto. Each of the first to eighth banks 111 to 118 may include a plurality of memory cells MCs connected between the wordlines WLs and the bitlines BLs. In this case, each of the plurality of memory cells may be implemented as a volatile memory cell or a non-volatile memory cell.

The row decoder 120 may include first to eighth bank row decoders 121 to 128 respectively connected to the first to eighth banks 111 to 118.

The column decoder 130 may include first to eighth bank column decoders 131 to 138 connected to the first to eighth banks 111 to 118, respectively.

The sense amplifier circuit 140 may include first to eighth bank sense amplifiers 141 to 148 respectively connected to the first to eighth banks 111 to 118. On the other hand, the first to eighth banks (111 to 118) may comprise first to eighth bank row decoders 121 to 128, first to eighth bank column decoders 131 to 138, and first to eighth bank sense amplifiers 141 to 148.

The address register 150 may receive an address (ADDR) having a Bank address (BANK_ADDR), a row address (ROW_ADDR) and a column address (COL_ADDR) from an external memory controller, and may store the address. The address register 150 may provide the received bank address BANK_ADDR to the bank control logic 152, the received row address ROW_ADDR to the row address multiplexer 156, and the received column address COL_ADDR to the column address latch 158.

The bank control logic 152 may generate bank control signals in response to the bank address BANK_ADDR. A bank row decoder corresponding to the bank address BANK_ADDR among the first to eighth bank row decoders 121 to 128 may be activated in response to the bank control signals. A bank column decoder corresponding to the bank address BANK_ADDR among the first to eighth bank column decoders 131 to 138 may be activated in response to the bank control signals.

The row address multiplexer 156 may receive a row address ROW_ADDR from the address register 150 and a refresh row address REF_ADDR from the refresh counter 154. The row address multiplexer 156 may selectively output the row address ROW_ADDR or the refresh row address REF_ADDR as the row address RA. The row address RA output from the row address multiplexer 156 may be applied to the first to eighth bank row decoders 121 to 128, respectively.

The bank row decoder activated by the bank control logic 152 among the first to eighth bank row decoders 121 to 128 may decode the row address RA output from the row address multiplexer 156 and may activate a wordline corresponding to the row address. For example, the activated bank row decoder may apply a wordline driving voltage to a wordline corresponding to a row address. Also, the activated bank row decoder may activate a wordline corresponding to the row address and simultaneously activate a redundancy wordline corresponding to the redundancy row address output from the repair control circuit.

The column address latch 158 may receive the column address COL_ADDR from the address register 150 and temporarily store the received column address COL_ADDR. Also, the column address latch 158 may gradually increase the received column address COL_ADDR in a burst mode. The column address latch 158 may apply the temporarily stored or gradually increased column address COL_ADDR to the first to eighth bank column decoders 131 to 138, respectively.

The bank column decoder activated by the bank control logic 152 among the first to eighth bank column decoders 131 to 138 may activate the sense amplifier corresponding to the bank address BANK_ADDR and the column address COL_ADDR through the input/output gating circuit 170. Also, the activated bank column decoder may perform a column repair operation in response to the column repair signal CRP output from the repair control circuit.

The control logic 160 may be implemented to control the operation of the memory device 100. For example, the control logic 160 may generate control signals so that the semiconductor memory device 100 performs a write operation or a read operation. The control logic 160 may include a command decoder 161 for decoding a command CMD received from the memory controller and a mode register set 162 for setting an operation mode of the memory device 100. For example, the command decoder 161 may decode the write enable signal (/WE), row address strobe signal (/RAS), column address strobe signal (/CAS), chip select signal (/CS), and the like, thereby generating operation control signals ACT, PCH, WE, and RD corresponding to the command CMD. The control logic 160 may provide the operation control signals ACT, PCH, WE, and RD to the timing control circuit. The control signals ACT, PCH, WR, and RD may include an active signal ACT, a precharge signal PCH, a write signal WR, and a read signal RD.

Each of the input/output gating circuits of the input/output gating circuit 170 may include input data mask logic, read data latches for storing data output from the first to eighth banks 111 to 118, and write drivers for writing data to the first to eighth banks 111 to 118, together with circuits that gate input and output data. A codeword (CW) to be read from one of the first to eighth banks 111 to 118 may be sensed by a sense amplifier corresponding to one bank and stored in read data latches. The codeword CW stored in the read data latches may be provided to the memory controller through the input/output buffer 190 after ECC decoding is performed by the error correction circuit 180. Data DQ to be written to one of the first to eighth banks 111 to 118 is subjected to ECC encoding in the error correction circuit 180, and then, may be written to one bank through write drivers.

The error correction circuit 180 (ECC1) generates parity bits based on the data bits of the data DQ provided from the input/output buffer 190 in a write operation, and provides a code word including data DQ and parity bits to the input/output gating circuit 170, and the input/output gating circuit 170 may write a codeword to the bank. Also, the error correction circuit 180 may receive the codeword CW read from one bank in a read operation from the input/output gating circuit 170. The error correction circuit 180 performs ECC decoding on the data DQ using parity bits included in the read codeword CW to correct at least one error bit included in the data DQ and may provide corrected bit to the input/output buffer 190.

The input/output buffer 190 may provide the data DQ to the error correction circuit 180 based on the clock CLK provided from the memory controller in a write operation, and may provide the data DQ provided from the error correction circuit 180 in a read operation to the memory controller.

The memory device 100 according to an example embodiment includes the clock buffer 101 having an intentionally imbalanced characteristic, thereby reducing or eliminating a duty error with respect to a clock signal and thus greatly improving the reliability of the clock signal.

Figure 3:
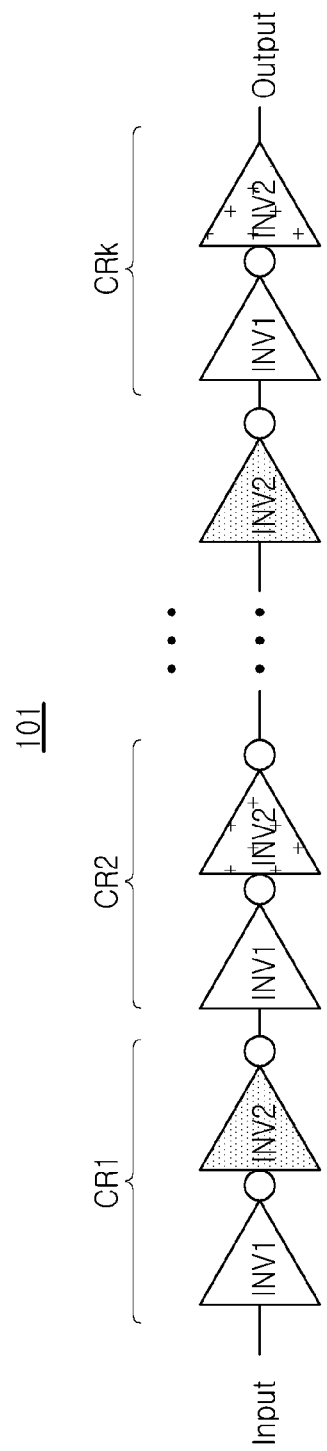
FIG. 3 is a diagram illustrating, by way of example, a clock buffer 101 according to an example embodiment.

FIG. 3 is a diagram illustrating a clock buffer 101 according to an example embodiment. Referring to FIG. 3, the clock buffer 101 may include serially connected clock repeaters (CR1 to CRk, where k is an integer greater than or equal to 2). In this case, each of the clock repeaters CR1 to CRk may include at least two inverters having different imbalanced characteristics from each other. In some embodiments, different successive clock repeaters may have different imbalanced characteristics compared to each other. On the other hand, in some embodiments, each of the successive clock repeaters CR1 to CRk may be implemented to have the same imbalanced characteristics as each other.

Figure 4A:
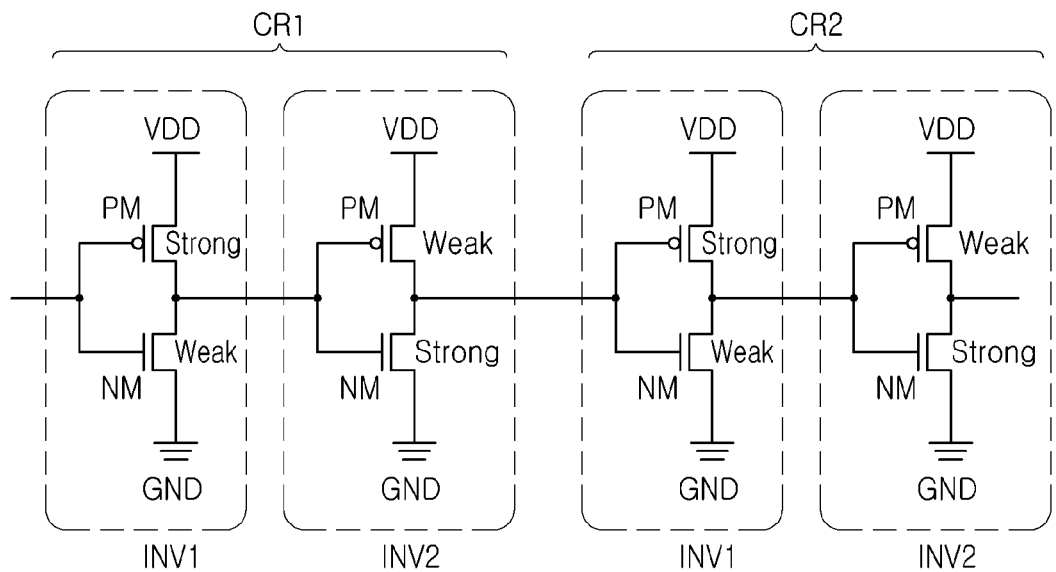
FIGS. 4A, 4B, 4C, and 4D are diagrams illustrating, by way of example, an example embodiment of a clock buffer composed of continuous clock repeaters according to an example embodiment.
Figure 4B:
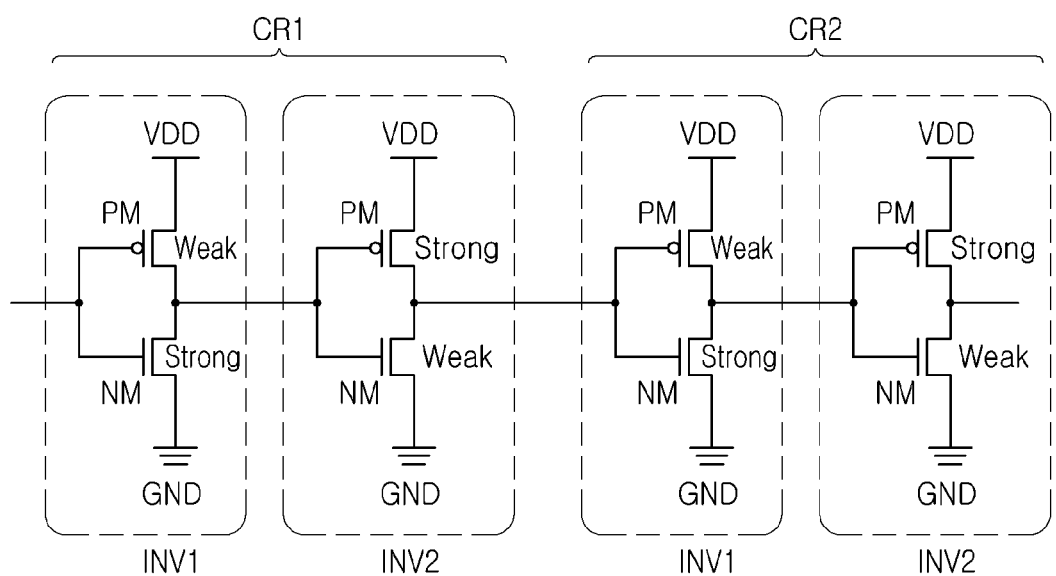

FIGS. 4A and 4B are diagrams illustrating successive clock repeaters having the same imbalance characteristic. As illustrated in FIG. 4A, each of the clock repeaters CR1 to CR2 includes a first inverter INV1 having strong pull-up characteristics (e.g., such that the pull-up response, current, and/or voltage is greater than (e.g., higher than, or faster than) the pull-down response, current, and/or voltage) and a second inverter INV2 having strong pull-down characteristics (e.g., such that the pull-down response, current, and/or voltage is greater than (e.g., higher than, or faster than) the pull-up response, current, and/or voltage). Two inverters INV1 and two inverters INV2 may be included. In the opposite case, as illustrated in FIG. 4B, each of the clock repeaters CR1 to CR2 includes a first inverter INV1 having strong pull-down characteristics and a second inverter INV2 having strong pull-up characteristics. In this case, in the inverter with strong pull-up characteristics, since the driving capability of the PMOS transistor PM is stronger than the driving capability of the NMOS transistor NM (for example, the W/L value (e.g., width to length value) may be higher in the PMOS transistor PM than in the NMOS transistor NM, and thus, the current driving capability is high and the PMOS transistor PM is able to more quickly apply VDD to the inverter output node than the NMOS transistor NM is able to apply a ground voltage to the inverter output node, for example), at the output stage, the high-level to low-level switching operation takes longer than the low-level to high-level switching operation time. Accordingly, an inverter having strong pull-up characteristics operates to increase the duty ratio. In an inverter having strong pull-up characteristics, the driving capability of the PMOS transistor PM is relatively stronger than that of the NMOS transistor NM.

On the other hand, in the inverter with strong pull-down characteristics, since the driving capability of the NMOS transistor NM is stronger than the driving capability of the PMOS transistor PM, in the output stage, a low-level to high-level switching operation time takes longer than a high-level to low-level switching operation time. Accordingly, an inverter with strong pull-down characteristics operates to reduce the duty ratio. In an inverter having strong pull-down characteristics, the driving capability of the NMOS transistor NM is relatively stronger than that of the PMOS transistor PM. These intentionally imbalanced driving capabilities may improve operation of the clock buffer 101, for example by reducing duty error.

In another embodiment, the adjacent clock repeaters CR1 and CR2 may be implemented to have characteristics that are imbalanced in different directions. For example, if the pull-up characteristic of the first clock repeater CR1 is relatively strong, in the case of the second clock repeater CR2 adjacent to the first clock repeater CR1, a pull-down characteristic may be strong. In this case, a repeater with strong pull-up characteristics is a repeater in which the duty ratio of the output signal increases compared to the duty ratio of the input signal, and repeaters with strong pull-down characteristics is the case opposite thereto. Accordingly, an increase in the duty ratio by the first clock repeater CR1 may be offset by a decrease in the duty ratio by the second clock repeater CR2. According to an example embodiment, a clock repeater having strong pull-up characteristics may be implemented, as the inverter at the output stage among the two inverters in the clock repeater is configured so that the pull-up characteristics are strong (e.g., the driving capability of the PMOS is stronger than that of the NMOS). A clock repeater with strong pull-down characteristics may be implemented, as the inverter on the output terminal side from among the two inverters in the clock repeater has strong pull-down characteristics (that is, the driving capability of NMOS is stronger than that of PMOS).

It should be understood that the clock buffer 101 of the present inventive concept is not limited to the illustrated one. The clock buffer of the present inventive concept may include one or more clock repeaters having intentionally imbalanced characteristics. As discussed herein, an intentionally imbalanced characteristic refers to an imbalance characteristic that is selected and/or designed in the clock repeater, rather than an imbalance characteristic that occurs incidentally as a result of typical manufacturing variations.

Figure 4C:
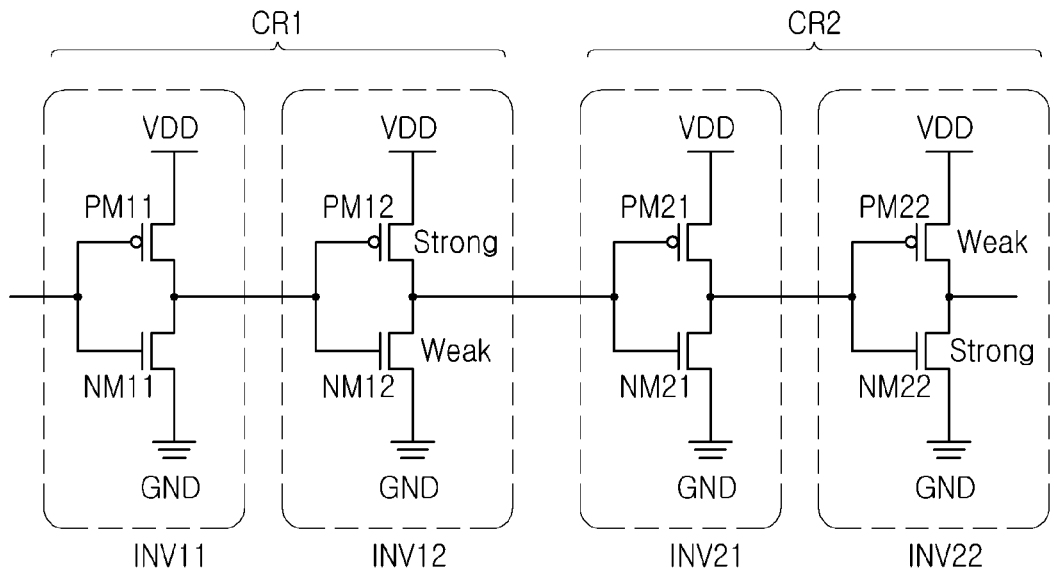
Figure 4D:
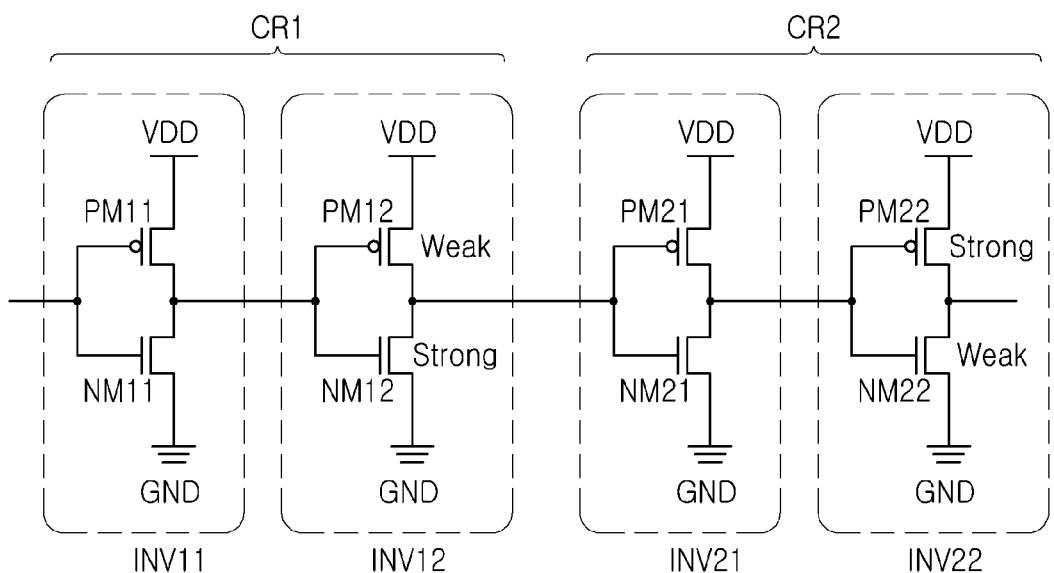

FIGS. 4C and 4D are diagrams illustrating an example embodiment of a clock buffer composed of continuous clock repeaters according to an example embodiment. In an example embodiment, a space between the clock repeaters (e.g., between INV12 and INV21 of FIG. 4C) may be implemented as a long metal line. Accordingly, the path between adjacent clock repeaters implemented with long metal lines may be longer than the path between the first inverter and the second inverter inside the clock repeater (e.g., between INV11 and INV12 and between INV21 and INV22).

Referring to FIG. 4C, the clock buffer 101 may include a first clock repeater CR1 having strong pull-up characteristics and a second clock repeater CR2 having strong pull-down characteristics.

The first clock repeater CR1 may have strong pull-up characteristics.

The first clock repeater CR1 may include a first inverter INV11 and a second inverter INV12. The first inverter INV11 may include a PMOS transistor PM11 connected to the power terminal VDD and an NMOS transistor NM11 connected to the ground terminal GND. A clock signal is input to the gates of the PMOS transistor PM11 and the NMOS transistor NM11. The drain of the PMOS transistor PM11 and the drain of the NMOS transistor NM11 are connected to each other. The output clock of the first inverter INV11 is output through the drain of the PMOS transistor PM11 and the drain of the NMOS transistor NM11. In an example embodiment, the driving capabilities of the PMOS transistor PM11 and the NMOS transistor NM11 may be implemented identically, to be balanced so that a duty cycle of the input to the first inverter INV11 is the same as the duty cycle of the output from the first inverter INV11.

The second inverter INV12 may include a PMOS transistor PM12 connected to the power terminal VDD and an NMOS transistor NM12 connected to the ground terminal GND. The output clock signal of the first inverter INV11 is input to the gates of the PMOS transistor PM12 and the NMOS transistor NM12. The drain of the PMOS transistor PM12 and the drain of the NMOS transistor NM12 are connected to each other. The output clock of the second inverter INV12 is output through the drain of the PMOS transistor PM12 and the drain of the NMOS transistor NM12. In an example embodiment, driving capabilities of the PMOS transistor PM12 and the NMOS transistor NM12 may be implemented differently. For example, as illustrated in FIG. 4A, the driving capability of the PMOS transistor PM12 may be strong and the driving capability of the NMOS transistor NM12 may be weak.

The second clock repeater CR2 may have strong pull-down characteristics.

The second clock repeater CR2 may include a first inverter INV21 and a second inverter INV22. The first inverter INV21 may include a PMOS transistor PM21 and an NMOS transistor NM21 connected between the power terminal VDD and the ground terminal GND. The output clock signal of the first clock repeater CR1 is input to the gates of the PMOS transistor PM21 and the NMOS transistor NM21. In an example embodiment, the driving capabilities of the PMOS transistor PM21 and the NMOS transistor NM21 may be identically implemented, to be balanced.

The second inverter INV22 may include a PMOS transistor PM22 and an NMOS transistor NM22 connected between the power terminal VDD and the ground terminal GND. The output clock signal of the first inverter INV21 is input to the gates of the PMOS transistor PM22 and the NMOS transistor NM22. In an example embodiment, driving capabilities of the PMOS transistor PM22 and the NMOS transistor NM22 may be implemented differently. For example, as illustrated in FIG. 4A, the driving capability of the PMOS transistor PM12 is weak and the driving capability of the NMOS transistor NM12 is strong.

As described above, the clock buffer 101 illustrated in FIG. 4C is implemented with a first clock repeater CR1 having strong pull-up characteristics and a second clock repeater CR2 having strong pull-down characteristics. However, the clock buffer of the present inventive concept need not be limited thereto.

As illustrated in FIG. 4D, the clock buffer 101a may be implemented with a first clock repeater CR1 having strong pull-down characteristics and a second clock repeater CR2 having strong pull-up characteristics. For example, the second inverter INV12 of the first clock repeater CR1 may be implemented with a PMOS transistor PM12 having a weak pull-up characteristic and an NMOS transistor NM12 having strong pull-down characteristics. Also, the second inverter INV22 of the second clock repeater CR2 may be implemented with a PMOS transistor PM22 having strong pull-up characteristics and an NMOS transistor NM22 having a weak pull-down characteristic.

FIGS. 4C and 4D illustrate a clock buffer in which clock repeaters having imbalanced characteristics are continuously and consecutively connected. However, the clock buffer of the present inventive concept does not require imbalanced clock repeaters to be connected consecutively.

Figure 5A:
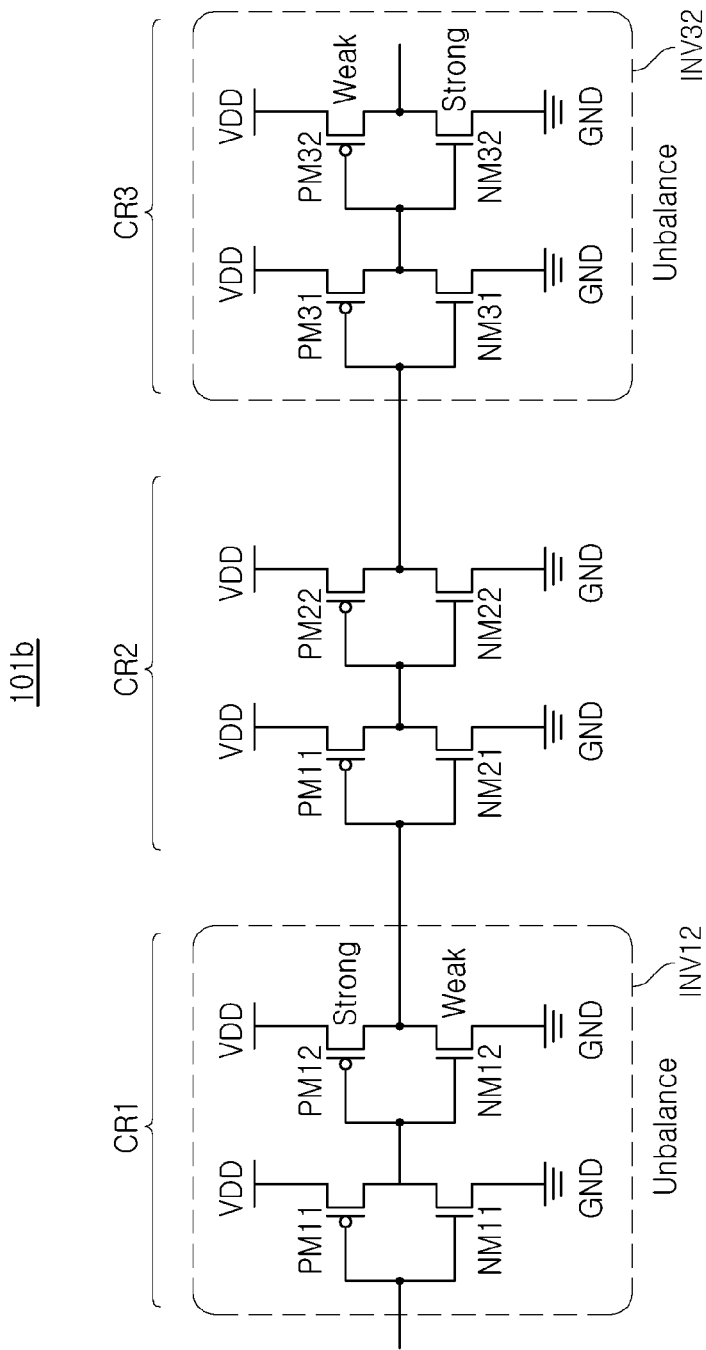
FIGS. 5A and 5B are diagrams illustrating, by way of example, clock buffers to which clock repeaters having an unbalance characteristic are discontinuously connected.
Figure 5B:
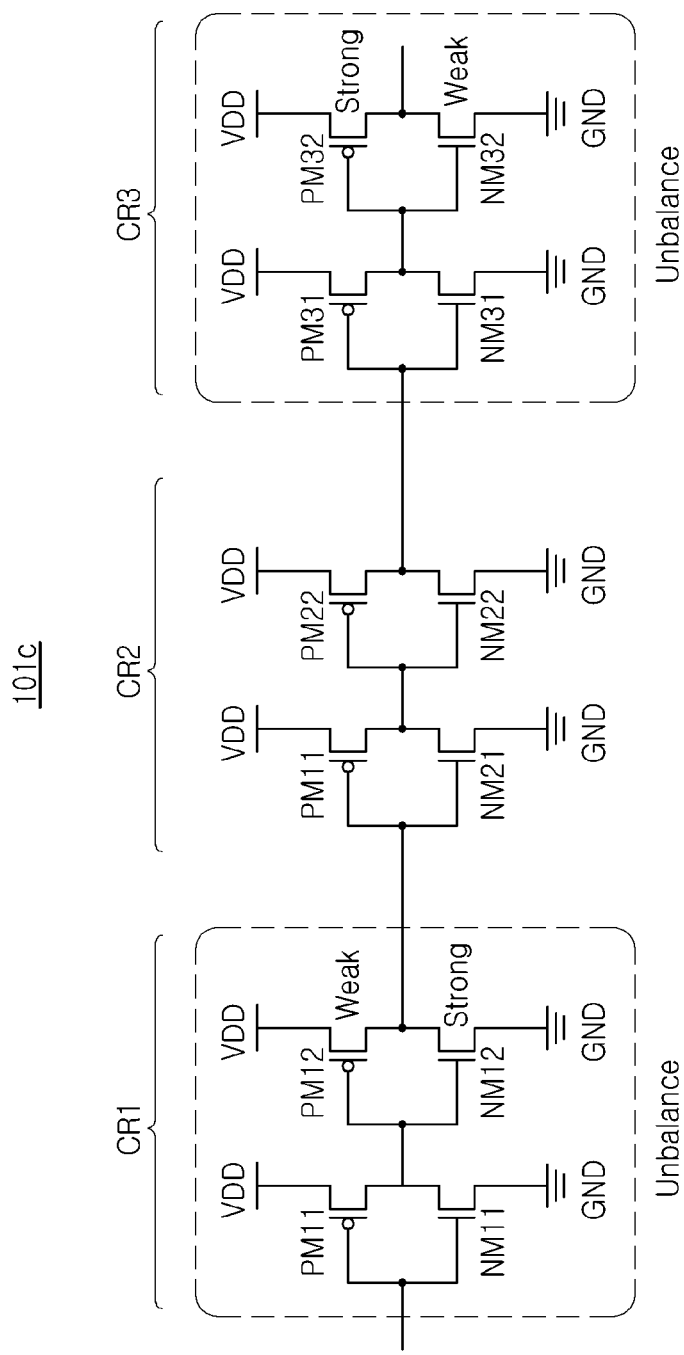

FIGS. 5A and 5B are diagrams illustrating clock buffers to which clock repeaters having imbalanced characteristics are discontinuously connected.

Referring to FIG. 5A, the clock buffer 101b may include a first clock repeater CR1, a second clock repeater CR2, and a third clock repeater CR3.

The first clock repeater CR1 and the third clock repeater CR3 may be implemented to have imbalanced characteristics. The second clock repeater CR2 may be implemented to have balanced characteristics. In an example embodiment, the first clock repeater CR1 may have strong pull-up characteristics, and the third clock repeater CR2 may implement strong pull-down characteristics. For example, the second inverter INV12 of the first clock repeater CR1 may be implemented with a PMOS transistor PM12 having strong pull-up characteristics and an NMOS transistor NM12 having a weak pull-down characteristic. Also, the second inverter INV32 of the third clock repeater CR2 may be implemented with a PMOS transistor PM22 having a weak pull-up characteristic and an NMOS transistor NM32 having strong pull-down characteristics.

Referring to FIG. 5B, the clock buffer 101c may be implemented by a first clock repeater CR1 having strong pull-down characteristics and a third clock repeater CR3 having strong pull-up characteristics, unlike the clock buffer 101b illustrated in FIG. 5A.

On the other hand, it should be understood that the clock buffers illustrated in FIGS. 5A and 5B are merely example embodiments of clock repeaters having discontinuously connected imbalanced characteristics. In the clock buffer of the present inventive concept, clock repeaters having imbalanced characteristics may be discontinuously connected in various other ways.

Figure 6:
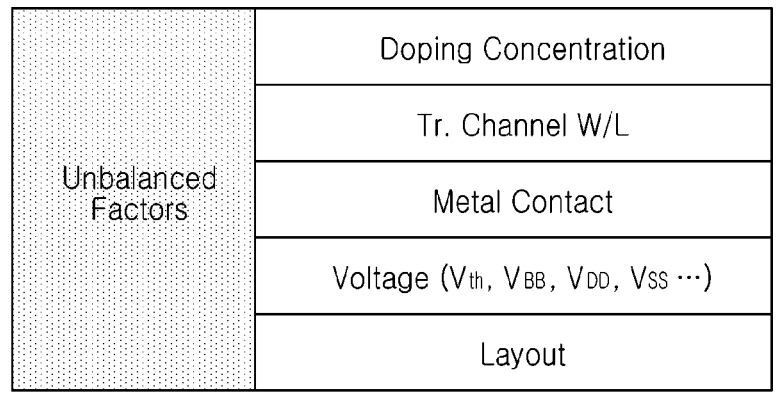
FIG. 6 is a view illustrating, by way of example, factors that have an unbalance characteristic of driving capability according to an example embodiment.

FIG. 6 is a view illustrating factors that may reflect imbalanced characteristics of driving capability according to an example embodiment. Referring to FIG. 6, the imbalance factors may include doping concentration of a transistor, channel width/length of transistor, location of metal contact, various voltages (e.g., threshold voltage (Vth), bias voltage (VBB), supply voltage (VDD), ground voltage (VSS), or the like), and a layout. The driving capability of the PMOS transistor and the NMOS transistor constituting the inverter may be set differently depending on at least one imbalance factor described above. For example, in the channel implantation operation of the PMOS/NMOS transistor, the threshold voltage may be lowered by lowering the doping concentration to increase the driving capabilities, or the driving capability may be strengthened as the channel width/length value increases. In addition, the position of the gate metal contact may be disposed relatively close to the portion of the transistor for which the driving capability is to be strengthened. In some embodiments, the memory device according to example embodiments may be implemented to vary the clock repeater path according to the operation mode. In some embodiments, the imbalanced characteristic and/or the imbalanced driving capability of the different transistors or inverters of a clock buffer may be due to imbalances that are equal in type and equal in magnitude, but different in direction.

Figure 7:
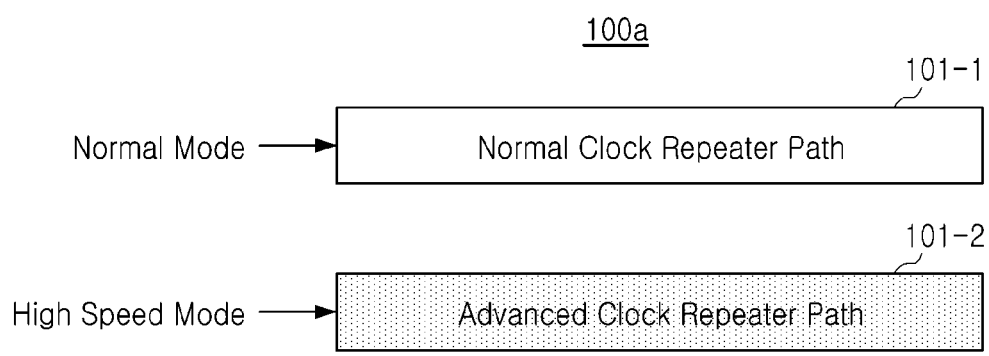
FIG. 7 is a diagram illustrating a memory device 100a according to another embodiment of the present inventive concept.

FIG. 7 is a diagram illustrating a memory device 100a according to another embodiment of the present inventive concept. Referring to FIG. 7, the memory device 100a may include a normal clock repeater path 101-1 and an advanced clock repeater path 101-2.

The normal clock repeater path 101-1 may be implemented as clock repeaters having balanced characteristics. In an example embodiment, the normal clock repeater path 101-1 may be activated in the normal mode.

The advanced clock repeater path 101-2 may include at least one clock repeater having an imbalanced characteristic. In this case, the clock repeater having the imbalanced characteristic may include inverters having different pull-up/pull-down characteristics as described with reference to FIGS. 1 to 6. In an example embodiment, the advanced clock repeater path 101-1 may be activated in high-speed mode.

On the other hand, it is not necessary to limit the advanced clock repeater path 101-1 to be active only in the high-speed mode. The advanced clock repeater path 101-1 may be implemented to be activated when necessary or desired for precise duty-control according to the judgment of the controller (see 200 in FIG. 1).

For example, to implement selection between a normal clock repeater path 101-2 and an advanced clock repeater path 101-1 a switching circuit may be used. For example, the memory device according to an example embodiment may add a bypass path to the imbalanced clock repeater path, connected to a switch, to switch between normal or advanced clock repeater mode.

Figure 8:
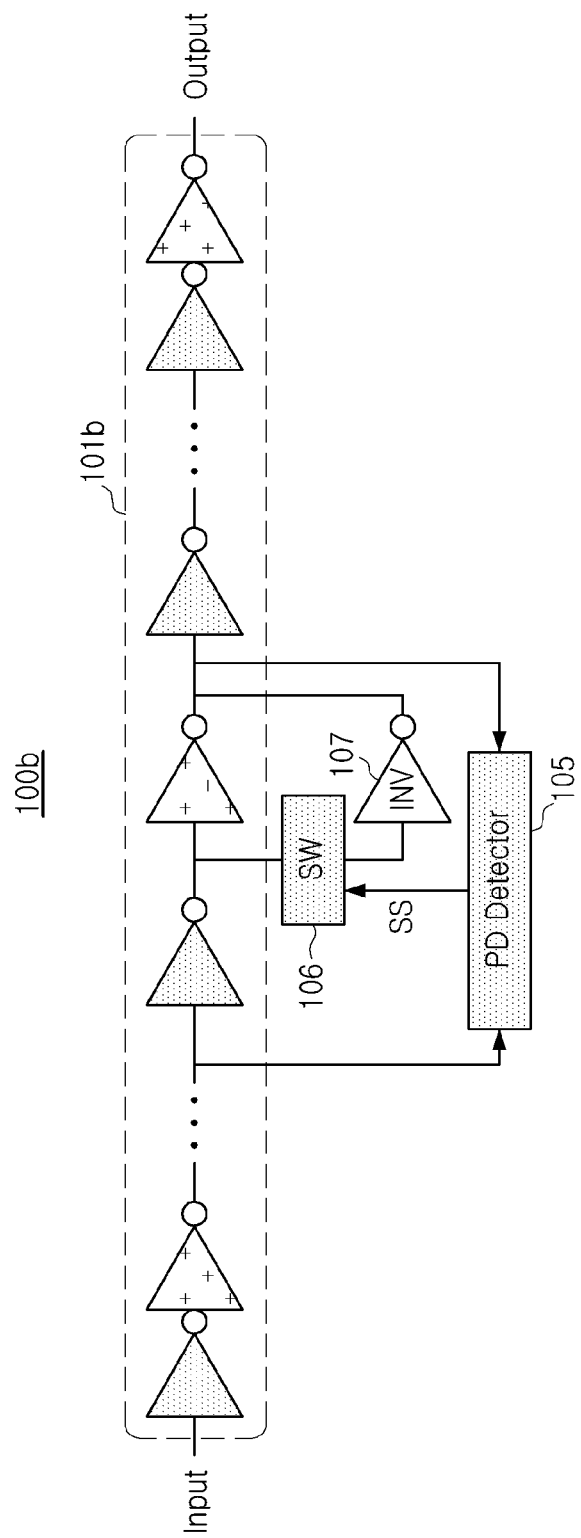
FIG. 8 is a diagram illustrating, by way of example, a memory device 100b according to another embodiment of the present inventive concept.

FIG. 8 is a diagram illustrating a memory device 100b according to another embodiment. Referring to FIG. 8, the memory device 100b may include a clock repeater path 101b, a phase detector 105, a switch 106, SW, and an inverter 107, INV.

The clock repeater path 101b may include an inverter having an imbalanced characteristic as described in FIGS. 1 to 7.

The phase detector 105 may be implemented to detect the phase of the output stage of all clock repeaters. The phase detector 105 may output the switch signal SS according to the detected phase. For example, the phase detector 105 may detect a malfunction of the clock repeater and output the switch signal SS according to the detection result. In the case of a clock repeater (or inverter) in which a malfunction is detected, the normal path to which an imbalanced characteristic is not applied may be bypassed. Also, a corresponding clock repeater paired with a malfunctioning clock repeater (i.e., either the malfunctioning clock repeater and either clock repeater with the opposite direction of imbalanced characteristic) may be bypassed by the normal route. In response to the switch signal SS, the switch 106 may select whether the path of the clock signal is to be the original clock repeater path 101b or the bypass path having the inverter 107. In this case, the inverter 107 may be an inverter having a balanced characteristic. Although FIG. 8 illustrates only bypass for one inverter for convenience of description, it should be understood that the present inventive concept is not limited thereto.

In FIGS. 1 to 8, the clock repeater path according to an example embodiment includes an inverter having an imbalanced characteristic. However, the clock repeater path of the inventive concept will not be limited thereto. The clock repeater path of one embodiment of the inventive concept is implemented with inverters having a balanced characteristic, and may include an inverter having an imbalanced characteristic in the bypass path.

Figure 9:
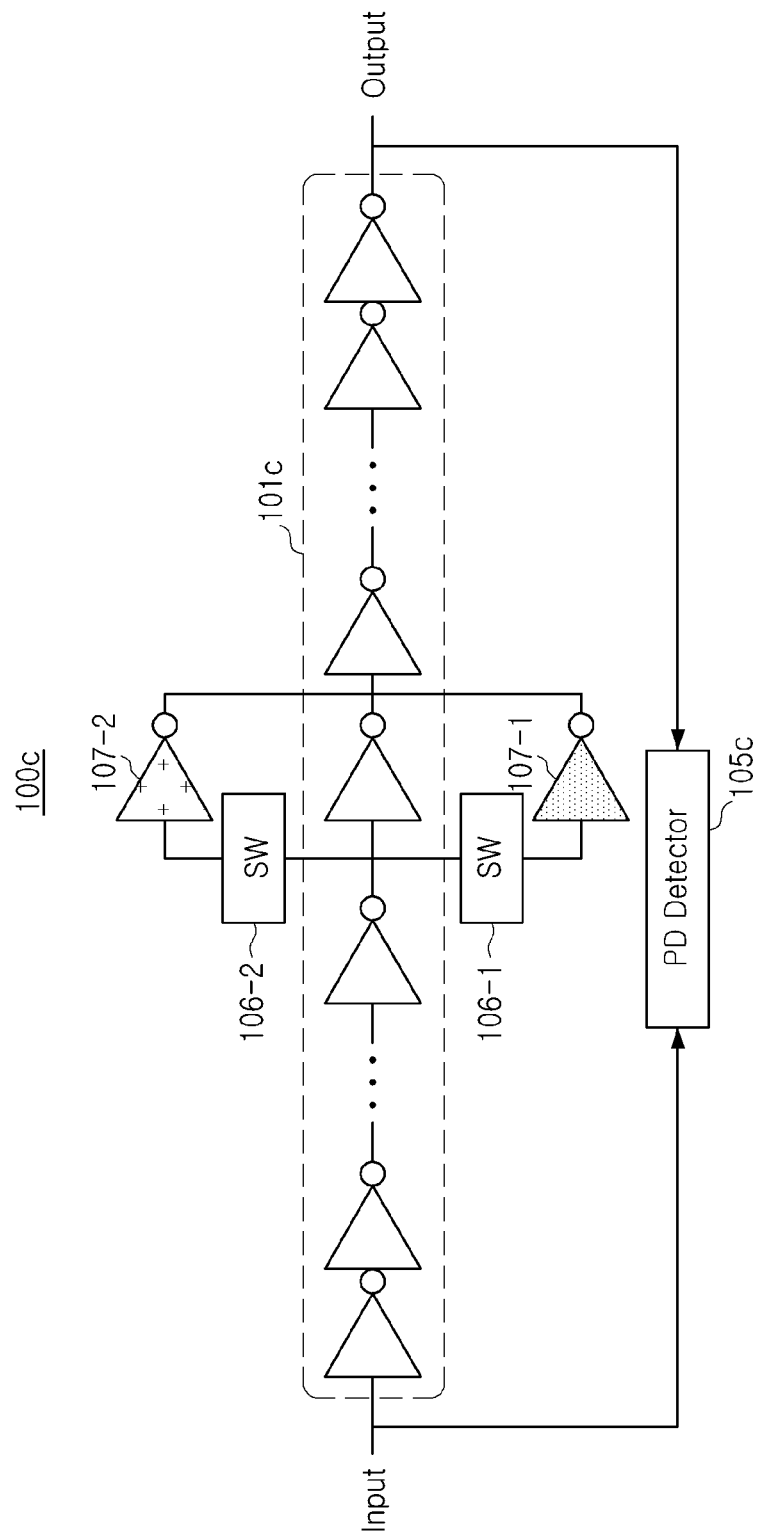
FIG. 9 is a diagram illustrating, by way of example, a memory device 100c according to another embodiment of the present inventive concept.

FIG. 9 is a diagram illustrating a memory device 100c according to another embodiment of the present inventive concept. Referring to FIG. 9, the memory device 100c includes a clock repeater path 101c, a phase detector 105c, a first switch 106-1, SW1, a second switch 106-2, SW2, an inverter 107-1, and a second unbalanced inverter 107-2.

The clock repeater path 101c may include series-connected inverters. In this case, each of the series-connected inverters may be implemented with a PMOS transistor and an NMOS transistor with balanced characteristics.

The phase detector 105c may be implemented to detect a phase between a clock signal between an input end and an output end. The phase detector 105c may generate a switch signal according to the detected phase difference.

The first switch 106-1 (SW1) may select the clock signal path from the clock repeater path 101c to the bypass path having the first inverter 107-1 in response to the switch signal. In this case, the first inverter 107-1 may be an inverter having imbalanced characteristics.

The second switch 106-2 (SW2) may select a path of the clock signal from the clock repeater path 101c to the bypass path with the second inverter 107-2 in response to the inverted signal of the switch signal. In this case, the second inverter 107-2 may be an inverter having an imbalanced characteristic. In an example embodiment, an imbalanced characteristic of the second inverter 107-2 may be different from an imbalanced characteristic of the first inverter 107-1. For example, the second inverter 107-2 may have strong pull-up characteristics, and the first inverter 107-1 may have strong pull-down characteristics.

The imbalanced clock repeater path according to some example embodiments may be used for a coarse/fine clock repeater path.

Figure 10A:
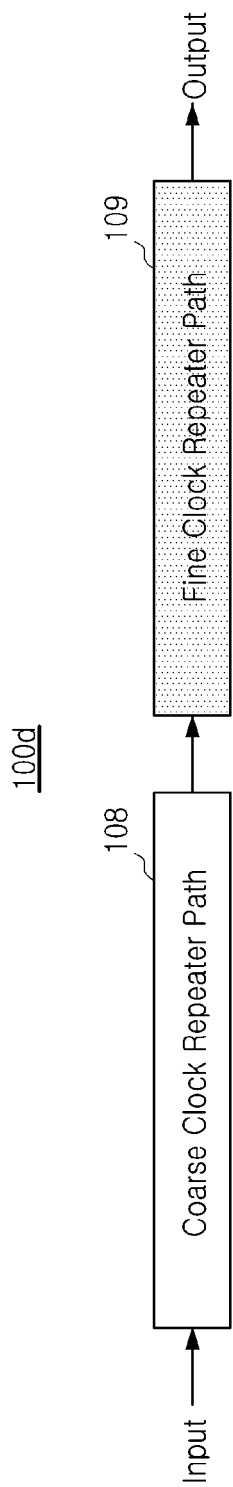
FIGS. 10A and 10B are diagrams illustrating, by way of example, a memory device having a clock repeater path according to another embodiment of the present inventive concept.
Figure 10B:
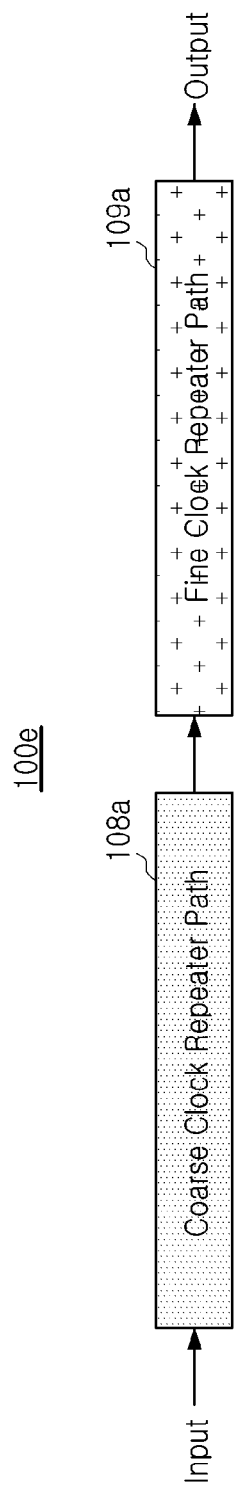

FIGS. 10A and 10B are diagrams illustrating, by way of example, a memory device having a clock repeater path according to another embodiment of the present inventive concept.

Referring to FIG. 10A, the memory device 100d may include a coarse clock repeater path 108 and a fine clock repeater path 109. In an example embodiment, the coarse clock repeater path 108 may include series-connected inverters having balanced characteristics. In an example embodiment, the fine clock repeater path 109 may include at least one inverter having an imbalanced characteristic as described in FIGS. 1 to 9.

Referring to FIG. 10B, the memory device 100e may include a coarse clock repeater path 108a and a fine clock repeater path 109a. In an example embodiment, the coarse clock repeater path 108a may include at least one inverter having a first imbalanced characteristic. In an example embodiment, the fine clock repeater path 109a may include at least one inverter having a second imbalanced characteristic, wherein the intensity corresponding to the second imbalanced feature is less than the intensity corresponding to the first imbalanced feature.

In either of these embodiments, the clock repeater path may be implemented as a coarse path and a fine path. Different degrees of coarse path and fine imbalance may be implemented. For example, the size of the tuning (the size of the resolution) may be different from each other. A coarse path may be used, and in the case in which the coarse path alone cannot completely cancel the duty error (i.e., when the duty error remains), the clock signal may be implemented to not pass through a portion of the coarse path but to be bypassed to a portion of the fine path (bypass).

The memory system according to an example embodiment may be implemented to monitor a duty error and adjust the duty according to the monitoring result.

Figure 11:
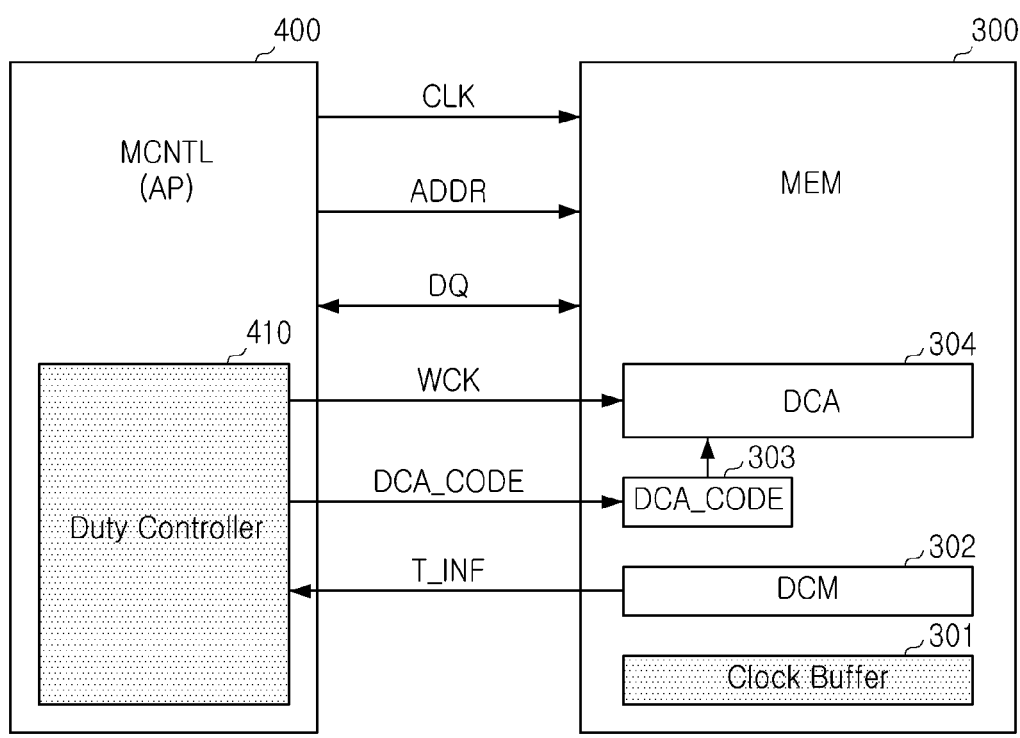
FIG. 11 is a diagram illustrating, by way of example, a memory system 20 according to another embodiment of the present inventive concept.

FIG. 11 is a diagram illustrating, by way of example, a memory system 20 according to another embodiment of the present inventive concept. Referring to FIG. 11, the memory system 20 may include a memory device 300 (MEM) and a memory controller 400 (MCNTL) for controlling it.

The memory device 300 may include a clock buffer 301, a duty cycle monitor 302, DCM, a register 303 and a duty cycle adjuster 304, DCA.

The clock buffer 301 may include a clock repeater path with the intentional imbalanced characteristic described in FIGS. 1-10.

The duty cycle monitor 302 (DCM) may be implemented to monitor the duty of a clock, for example, a data transfer clock (WCK). For example, the duty cycle monitor 302 may monitor the duty of the data transmission clock WCK passing through the write/read path in the DCA training period.

The register 303 may store the DCA code value DCA_CODE transmitted from the memory controller 400.

The duty cycle adjuster 304 (DCA) may be implemented to optimize the duty of the clock buffer 301 using a DCA code value.

The memory controller 400 may include a duty controller 410 that controls the duty of the memory device 300. The duty controller 410 transmits the data transfer clock WCK to the memory device 300, receives training information T_INF related to DCA training from the memory device 300, and receives the training information T_INF corresponding to the training information T_INF. A DCA code value (DCA_CODE) may be output to the memory device 300.

The memory system 20 according to an example embodiment includes the memory device 300 that removes the duty error itself and the controller 400 that controls the duty of the memory device 300, such that the transmission clock signal WCK may have greatly improved reliability.

Figure 12:
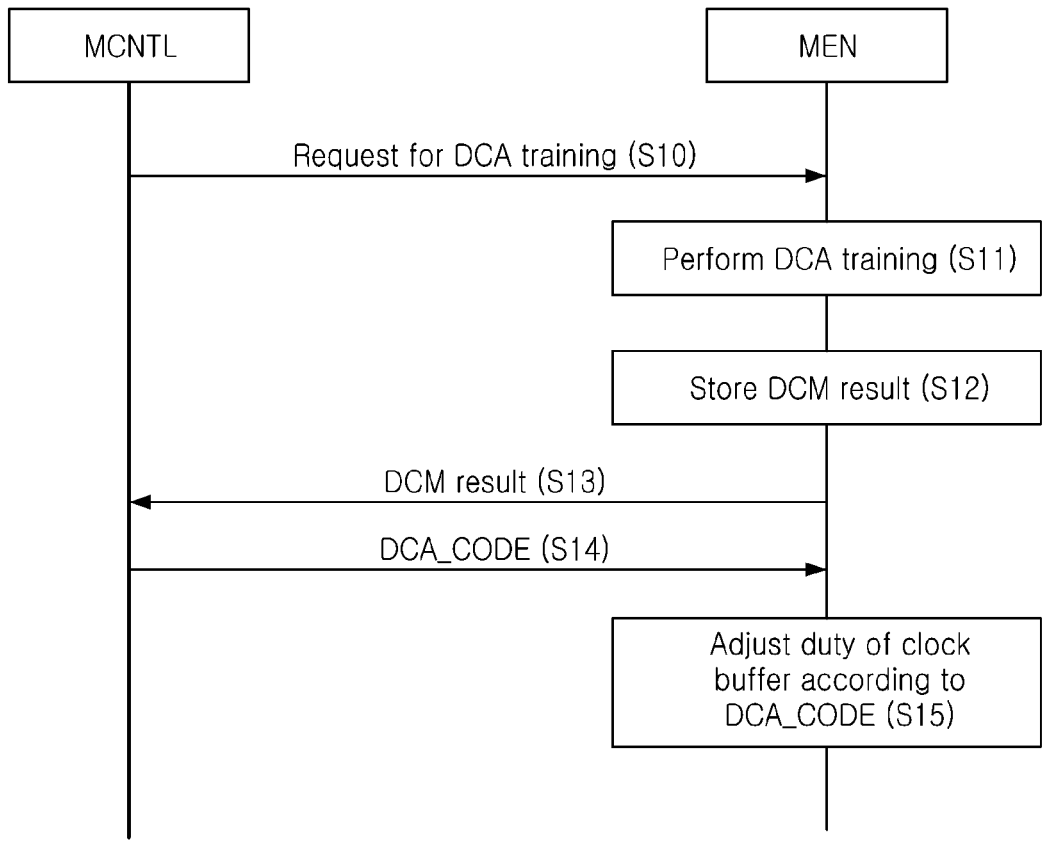
FIG. 12 is a ladder diagram illustrating, by way of example, a method of operating a memory system according to an example embodiment.

FIG. 12 is a ladder diagram illustrating, by way of example, a method of operating a memory system according to an example embodiment. Referring to FIG. 12, the operation method of the memory system may include the following.

The memory controller MCNTL may transmit a DCA training request to the memory device MEM (S10). The duty cycle monitor DCM of the memory device MEM may perform a training operation on the clock buffer 301 (refer to FIG. 11) according to the DCA training request (S11). A result value for the DCA training result may be stored in the register 303 (S12). The DCA training result value stored in the register 303 may be output to the memory controller MCNTL (S13). The memory controller MCNTL may receive a DCA training result value from the memory device MEM, and output a DCA code value DCA_CODE corresponding to the received result value to the memory device MEM (S14). The duty cycle adjuster DCA of the memory device MEM may adjust the duty of the clock buffer 301 (refer to FIG. 11) in response to the DCA code value DCA_CODE (S15). For example, the duty cycle can be set by using one of the implementations described previously for setting duty cycles using clock repeaters and/or inverters with imbalanced characteristics.

Figure 13:
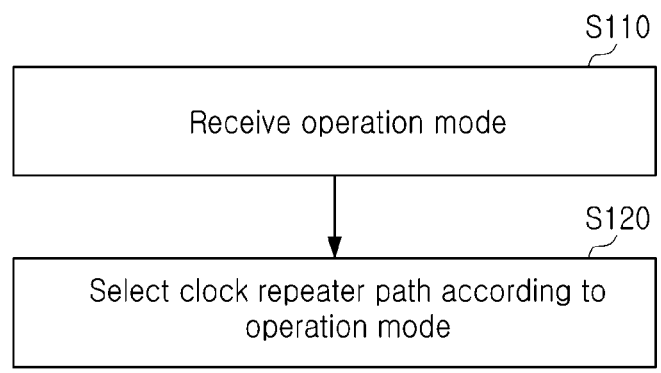
FIG. 13 is a flowchart illustrating, by way of example, an operation of a memory device according to an example embodiment.

FIG. 13 is a flowchart illustrating, by way of example, an operation of a memory device according to an example embodiment. 1 to 13, the memory device 100 may operate as follows. The memory device 100 may receive an operation mode from the memory controller 200 (refer to FIG. 1) (S110). The memory device 100 may select a clock repeater path according to the received operation mode (S120). For example, when the operation mode is the special mode, the memory device 100 may select a path having an intentional imbalanced characteristic as the clock repeater path.

A memory device according to an example embodiment is applicable to a memory module.

Figure 14:
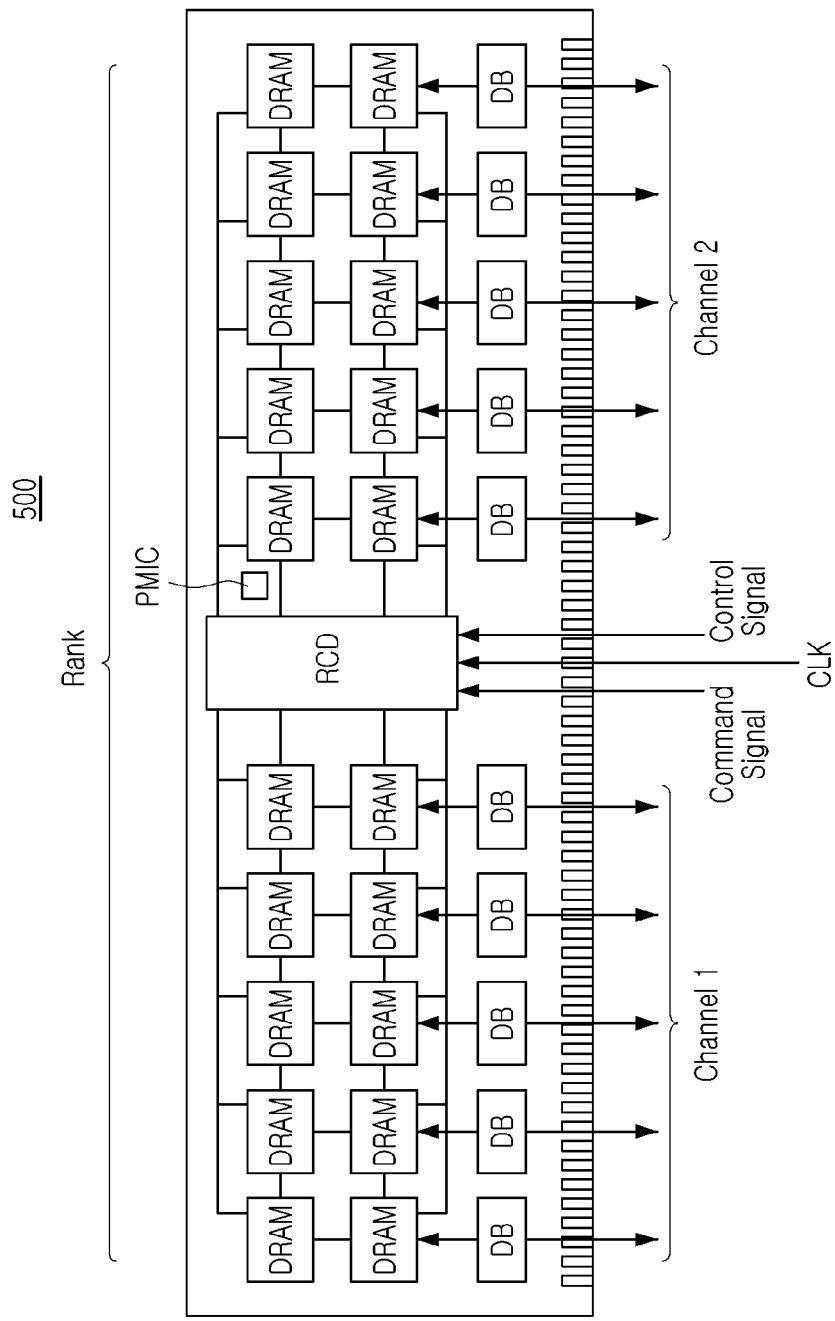
FIG. 14 is a diagram illustrating, by way of example, a memory module 500 according to an example embodiment.

FIG. 14 is a diagram illustrating, by way of example, a memory module 500 according to an example embodiment. Referring to FIG. 14, the memory module 500 may include a plurality of memory chips (DRAMs) each including a memory cell array, a buffer chip (RCD) for routing transmission/reception signals with the memory controller or managing memory operations for the memory chips, and a Power Management Chip (PMIC). Each of the plurality of memory chips may include a clock repeater path having an intentionally imbalanced characteristic as described in FIGS. 1 to 13.

The RCD may control the memory chips (DRAM) and the power management chip (PMIC) under the control of the memory controller. For example, the RCD may receive a command signal, a control signal and a clock signal from the memory controller.

Each of the memory chips (DRAM) is connected to a corresponding data buffer among the data buffers (DB) through a corresponding data transmission line. The data signal DQ and the data strobe signal DQS may be exchanged. The memory chips DRAM are respectively connected to the data buffer DB through corresponding data transmission lines to transmit and receive parity data PRT and data strobe signal DQS.

The SPD chip (not illustrated) may be a programmable read only memory (EEPROM). The SPD chip may include device information or initial information of the memory module 1000. As an example, the SPD chip may include initial information or device information, such as module type, module configuration, storage capacity, module type, execution environment, the like of the memory module 500. When the memory system including the memory module 500 is booted, the memory controller reads device information from the SPD chip and recognizes the memory module based on the read device information.

In an example embodiment, the rank may include 8 bank groups. Each of the bank groups may include four banks. In an example embodiment, the memory chips may be divided into first channel dedicated memory chips and second channel dedicated memory chips.

In some embodiments, the memory device of the present inventive concept is applicable to a computing device.

Figure 15:
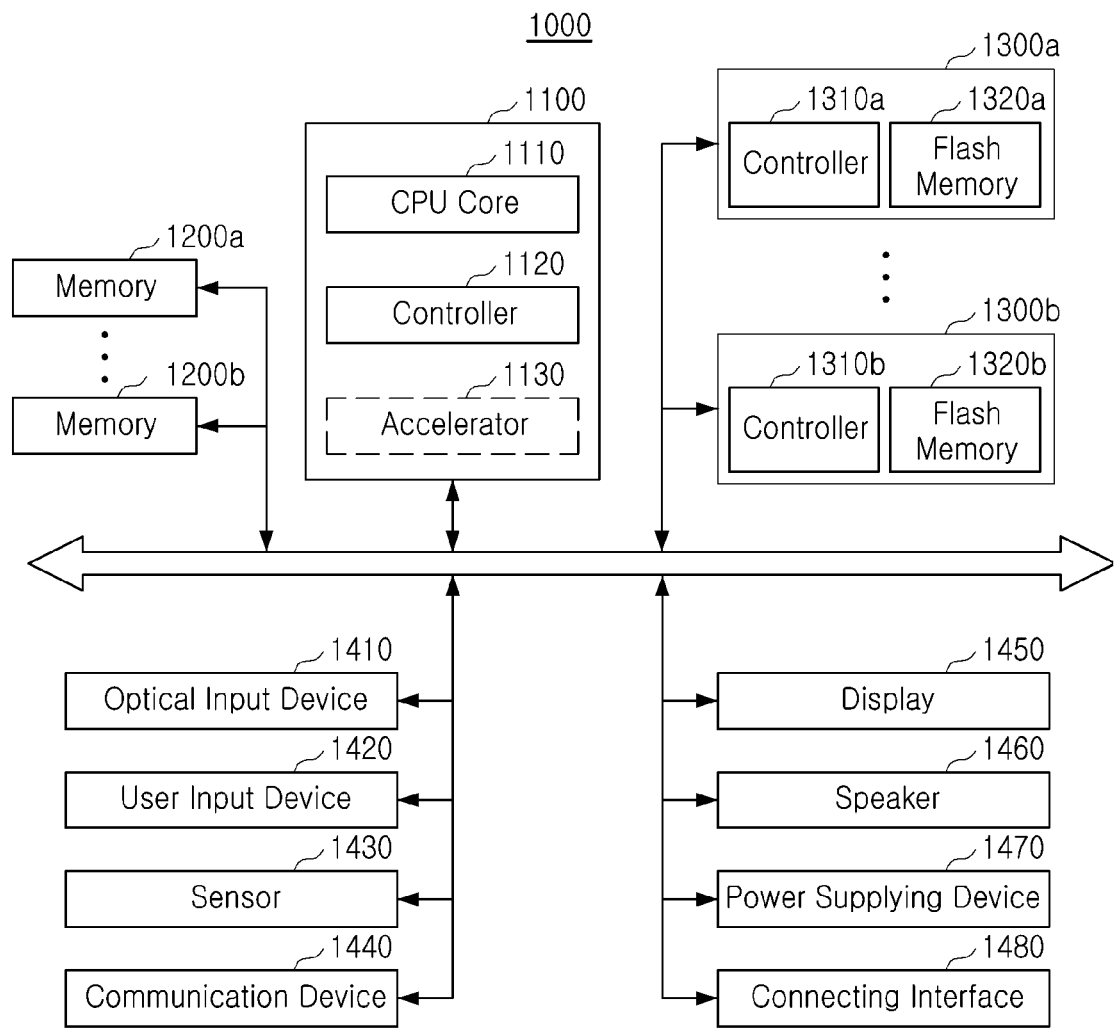
FIG. 15 is a diagram illustrating, by way of example, a computing system 1000 according to an example embodiment.

FIG. 15 is a diagram illustrating, by way of example, a computing system 1000 according to an example embodiment. Referring to FIG. 15, the system 1000 may include a main processor 1100, memories 1200*a* and 1200*b*, and storage devices 1300*a* and 1300*b*, and additionally, may include one or more of an image capturing device 1410, a user input device 1420, a sensor 1430, a communication device 1440, a display 1450, a speaker 1460, a power supply device (1470) and the connecting interface (1480).

The main processor 1100 may control the overall operation of the system 1000, and more specifically, the operation of other components constituting the system 1000. The main processor 1100 may be implemented as a general-purpose processor, a dedicated processor, or an application processor.

The main processor 1100 may include one or more CPU cores 1110 and may further include a controller 1120 for controlling the memories 1200*a* and 1200*b* or the storage devices 1300*a* and 1300*b*. In an example embodiment, the main processor 1100 may further include an accelerator block 1130 that is a dedicated circuit for high-speed data operation such as artificial intelligence (AI) data operation. The accelerator block 1130 may include a graphics processing unit (GPU), a neural processing unit (NPU), a data processing unit (DPU), and the like, and may be implemented as a separate chip physically independent from other components of the main processor 1100.

The memories 1200*a* and 1200*b* may be used as the main memory device of the system 1000 and may include volatile memories such as SRAM or DRAM, and a non-volatile memory such as flash memory, PRAM or RRAM. The memories 1200*a* and 1200*b* may be implemented in the same package as the main processor 1100. In detail, the memories 1200*a* and 1200*b* may include a clock buffer provided to have an intentionally imbalanced characteristic to reduce a process error internally as described with reference to FIGS. 1 to 14.

The storage devices 1300*a* and 1300*b* may function as non-volatile storage devices that store data regardless of whether power is supplied or not, and may have a relatively large storage capacity compared to the memories 1200*a* and 1200*b*. The storage devices 1300*a* and 1300*b* may include storage controllers 1310*a* and 1310*b* and non-volatile memory (NVM) storage 1320*a* and 1320*b* that stores data under the control of the storage controllers 1310*a* and 1310*b*. The non-volatile memories 1320*a* and 1320*b* may include a V-NAND flash memory having a 2D (2-dimensional) structure or a 3D (7-dimensional) structure, and may include other types of non-volatile memory such as PRAM or RRAM.

The storage devices 1300*a* and 1300*b* may be included in the system 1000 in a state physically separated from the main processor 1100, and may be implemented in the same package as the main processor 1100. In addition, the storage devices 1300*a* and 1300*b* may have the same shape as a solid state device (SSD) or a memory card, and may be detachably coupled to other components of the system 1000 through an interface such as a connection interface 2480 to be described later. The storage devices 1300*a* and 1300*b* may be devices to which standard protocols such as universal flash storage (UFS), embedded multi-media card (eMMC), or non-volatile memory express (NVMe) are applied, but are not necessarily limited thereto.

The image capture device 1410, also described as an optical input device, or a photographing device, may photograph a still image or a moving image, and may be a camera, a camcorder, or a webcam.

The user input device 1420 may receive various types of data input from a user of the system 1000, and may be or may include a touch pad, a keypad, a keyboard, a mouse, or a microphone.

The sensor 1430 may detect various types of physical quantities that may be acquired from the outside of the system 1000, and may convert the sensed physical quantities into electrical signals. The sensor 1430 may be, for example, a temperature sensor, a pressure sensor, an illuminance sensor, a position sensor, an acceleration sensor, a biosensor, or a gyroscope.

The communication device 1440 may transmit and receive signals between other devices outside the system 1000 according to various communication protocols. Such a communication device 2440 may be implemented including an antenna, a transceiver, or a modem (MODEM).

The display 1450 and the speaker 1460 may function as output devices for outputting visual information and auditory information to the user of the system 1000, respectively.

The power supply device 1470 may appropriately convert power supplied from a battery built into the system 1000 or an external power source and supply it to each component of the system 1000.

The connection interface 1480 may provide a connection between the system 1000 and an external device connected to the system 1000 to exchange data with the system 1000. The connection interface 1480 may be implemented in various interface methods, such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 1394, universal serial bus (USB), secure digital (SD) card, multi-media card (MMC), embedded multi-media card (eMMC), Universal Flash Storage (UFS), embedded Universal Flash Storage (eUFS), compact flash (CF) card interface, or the like.

Figure 16:
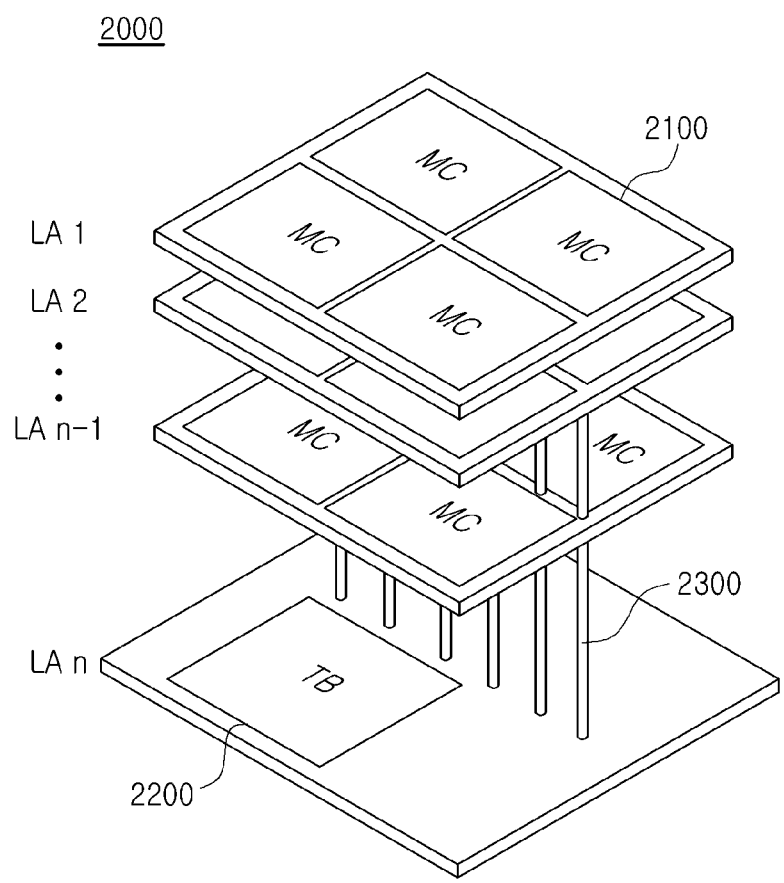
FIG. 16 is a block diagram illustrating a semiconductor package having a stacked structure including a plurality of layers according to an example embodiment.

FIG. 16 is a block diagram illustrating a semiconductor package having a stacked structure including a plurality of layers according to an example embodiment. Referring to FIG. 16, the semiconductor package 2000 may include a plurality of layers LA1 to LAn. Each of the first layer LA1 to the n−1 th layer LAn may be a memory layer (or a memory chip) including a plurality of memory cores MC. The memory core MC may include a memory cell array for storing data, a row decoder, a column decoder, a sense amplifier circuit, and an error correction circuit. In detail, the error correction circuit of the present inventive concept may be implemented to perform different ECCs according to physical locations. For example, different ECC operations may be performed for each layer. In detail, the memory cores MC may include a clock buffer provided to have an intentionally imbalanced characteristic to reduce a process error internally as described with reference to FIGS. 1 to 13.

The n-th layer LAn may be a buffer layer (or a buffer chip). In the semiconductor package 2000, the layers LA1 to LAn of the stacked structure may be interconnected through a through silicon via (TSV) 2300. The buffer layer LAn may communicate with the external memory controller and the memory layers LA1 to LAn−1, and may route transmission/reception signals between the memory layers LA1 to LAn−1 and the memory controller. Furthermore, the buffer layer LAn may queue signals received from the memory controller or the memory layers LA1 to LAn−1. Also, the buffer layer LAn may include a training block 2200. The buffer layer LAn may use the training block 2200 to perform a training operation on the memory layers LA1 to LAn−1.

Figure 17:
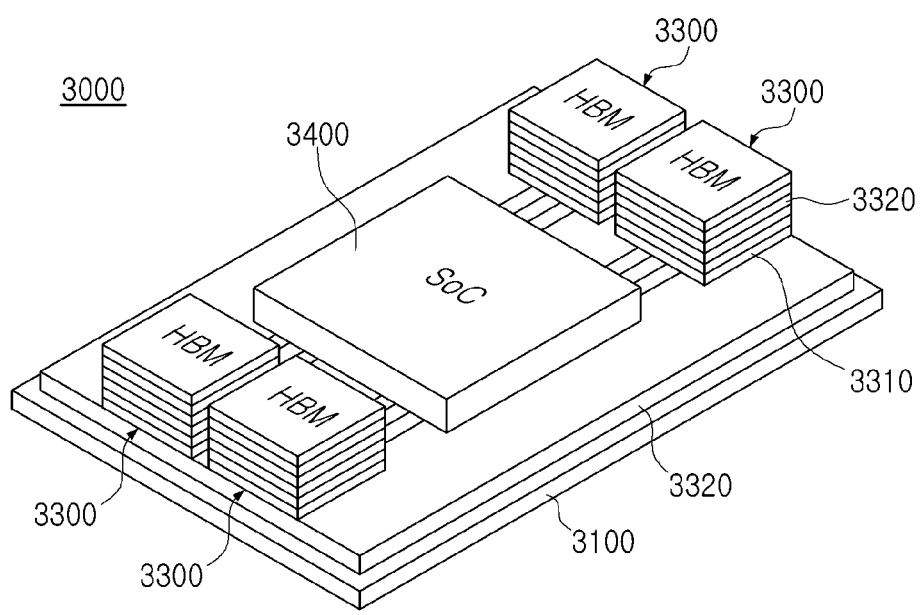
FIG. 17 is a diagram illustrating a semiconductor package including a stacked semiconductor chip according to an example embodiment.

FIG. 17 is a diagram illustrating a semiconductor package including a stacked semiconductor chip according to an example embodiment. Referring to FIG. 17, the semiconductor package 3000 may be a memory module including at least one stack of semiconductor chips 3300 and system-on-chip (SOC) 3400 mounted on a package substrate 3100 such as a printed circuit board. An interposer 3200 may be optionally further provided on the package substrate 3100. The stacked semiconductor chip 3300 may be composed of a Chip-on-Chip (Co C package).

The stack of semiconductor chips 3300 may include at least one memory chip 3320 stacked on a buffer chip 3310 such as a logic chip. The memory chip 3320 may include a clock buffer having an intentional unbalance characteristic as described in FIGS. 1 to 14.

The buffer chip 3310 and the at least one memory chip 3320 may be connected to each other by a through silicon via (TSV). The buffer chip 3320 may perform a training operation on the memory chip 3320. The stacked semiconductor chip 3300 may be, for example, a high bandwidth memory (HBM) of 500 GB/sec to 1 TB/sec, or more.

According to an example embodiment of the present inventive concept, the situation in which the duty error of the clock signal transmitted through the clock repeater path is cumulatively increased may be prevented without adding an additional configuration. In two adjacent repeaters (1st repeater and 2nd repeater) in the path, an intentionally imbalanced characteristic between PMOS-NMOS is generated in the inverter (1st inverter) on the output side of the 1st repeater and the inverter (2nd inverter) on the output side of the 2nd repeater, and the direction of unbalance may be set to be different between the 1st inverter and the 2nd inverter. By setting the intentionally imbalanced characteristic in different directions for the 1st inverter and the 2nd inverter, the direction (trend) of the process error may also be opposite to each other between the 1st inverter and the 2nd inverter. Therefore, the duty error may be canceled and eliminated in the repeater.

For example, if the characteristic subject to the occurrence of imbalance is the doping concentration, in the 1st inverter, the doping concentration of the PMOS transistor may be greater than (e.g., in one embodiment, 10 times) the doping concentration of the NMOS transistor. In this case, the PMOS transistor has a stronger characteristic than that of the NMOS transistor, and in the 2nd inverter, the doping concentration of the NMOS transistor may be greater than (e.g., 10 times stronger than) the doping concentration of the PMOS transistor. In this case, an imbalance may occur in the direction where the NMOS transistor has stronger characteristics than the PMOS transistor. Other types of characteristics may be adjusted to have an imbalance to achieve the imbalanced clock repeaters as described herein.

In example embodiments of the present inventive concept, duty error correction may be performed using an inverter pair to which intentionally imbalanced characteristic is applied.

As set forth above, in a memory device, a memory system including the same, and a method of operating the same according to an example embodiment, a duty of a clock signal may be removed using clock repeaters having intentionally imbalanced characteristics.

While example embodiments have been illustrated and described above, it will be apparent to those skilled in the art that modifications and variations could be made without departing from the scope of the present invention as defined by the appended claims.

We claim:
1. A memory device comprising:
a memory cell array having memory cells connected to wordlines and bitlines; and
a clock buffer configured to receive a clock signal for performing a read operation or a write operation on at least one of the memory cells,
wherein the clock buffer includes a plurality of serially connected clock repeaters, and
wherein the plurality of clock repeaters include at least one pair of clock repeaters comprising a first clock repeater in which a driving capability of a P-channel metal oxide semiconductor (PMOS) transistor is higher than a driving capability of an N-channel metal oxide semiconductor (NMOS) transistor, and a second clock repeater in which a driving capability of a PMOS transistor is lower than a driving capability of an NMOS transistor.

2. The memory device of claim 1, wherein each of the plurality of clock repeaters includes a first inverter configured to invert the clock signal, and a second inverter configured to invert a clock signal output from the first inverter.

3. The memory device of claim 2, wherein in each first inverter, a PMOS transistor and an NMOS transistor have a balanced driving capability, and in each second inverter, a PMOS transistor and an NMOS transistor have an imbalanced driving capability.

4. The memory device of claim 2, wherein each of the first and second inverters includes,
a PMOS transistor having a gate receiving the clock signal and a source connected to a power terminal; and
an NMOS transistor having a gate receiving the clock signal, a drain connected to a drain of the PMOS transistor, and a source connected to a ground terminal.

5. The memory device of claim 1, wherein in at least one of the first clock repeater and the second clock repeater, a degree of imbalance between the driving capability of the NMOS transistor and the PMOS transistor is controlled by a doping concentration, a channel width/length of a transistor, a metal contact, at least one voltage, or a layout.

6. The memory device of claim 1, wherein the plurality of clock repeaters include a first clock repeater having an imbalanced driving capability in a first direction and a second clock repeater having an imbalanced driving capability in a second direction,
wherein the first direction is a direction to increase pull-up strength of the driving capability, and
wherein the second direction is a direction to increase pull-down strength of the driving capability.

7. The memory device of claim 6, wherein the first clock repeater and the second clock repeater are disposed consecutively and sequentially.

8. The memory device of claim 6, wherein a clock repeater having a balanced characteristic of the driving capability is disposed between the first clock repeater and the second clock repeater.

9. The memory device of claim 1, further comprising a phase detector configured to detect a phase difference between an input terminal and an output terminal of the clock buffer,
wherein the at least one clock repeater is configured to be bypassed based on the phase difference.

10. A memory device comprising:
a first clock repeater; and
a second clock repeater,
wherein each of the first and second clock repeaters includes a first inverter configured to invert a clock signal, and a second inverter configured to invert a clock signal output from the first inverter,
wherein the second inverter of the first clock repeater has an imbalanced driving capability in a first direction, and
wherein the second inverter of the second clock repeater has an imbalanced driving capability in a second direction.

11. The memory device of claim 10, wherein the first clock repeater is connected to the second clock repeater through a metal line,
wherein the metal line is longer than a first path between the first inverter and the second inverter of the first clock repeater and is longer than a second path between the first inverter and the second inverter of the second clock repeater.

12. The memory device of claim 11, wherein the first direction is a direction to increase pull-up strength of a driving capability, and
the second direction is a direction to increase pull-down strength of the driving capability.

13. The memory device of claim 11, wherein the first direction is a direction to increase pull-down strength of a driving capability, and
the second direction is a direction to increase pull-up strength of the driving capability.

14. The memory device of claim 11, further comprising a clock repeater between an output terminal of the first clock repeater and an input terminal of the second clock repeater,
wherein a first inverter of the clock repeater and a second inverter of the clock repeater have a balanced characteristic of driving capabilities.

15. The memory device of claim 11, wherein the clock signal is a data transfer clock.

16. A memory system comprising:
a memory device; and
a memory controller configured to control the memory device,
wherein the memory device includes a clock buffer receiving a clock signal from the memory controller, the clock buffer configured to receive a clock signal for performing a read operation or a write operation on at least one memory cell of the memory device,
wherein the clock buffer includes a plurality of serially connected clock repeaters, and
wherein the plurality of clock repeaters have at least one pair of clock repeaters comprising a first clock repeater in which a driving capability of a PMOS transistor is higher than a driving capability of an NMOS transistor, and a second clock repeater in which a driving capability of a PMOS transistor is lower than a driving capability of an NMOS transistor.

17. The memory system of claim 16, wherein the plurality of clock repeaters include,
first clock repeaters having a first imbalanced driving capability, and
second clock repeaters having a second imbalanced driving capability,
wherein the first imbalanced driving capability and the second imbalanced driving capability are different from each other.

18. The memory system of claim 16, wherein the plurality of clock repeaters include,
a coarse clock repeater path configured to receive the clock signal; and
a fine clock repeater path configured to receive a clock signal output from the coarse clock repeater path,
wherein a magnitude of a driving capability of the coarse clock repeater path is greater than a magnitude of a driving capability of the fine clock repeater path.

19. The memory system of claim 18, wherein at least one of the coarse clock repeater path and the fine clock repeater path includes a clock repeater having an imbalanced driving capability.

20. The memory system of claim 18, wherein the memory device is configured to monitor a duty cycle of the clock buffer, and
wherein the memory controller is configured to adjust a duty cycle of the clock buffer according to a result of the monitoring.

* * * * *